United States Patent [19]

Nakano et al.

[11] Patent Number: 4,870,617

[45] Date of Patent: Sep. 26, 1989

[54] SEMICONDUCTOR MEMORY DEVICE HAVING DATA BUS RESET CIRCUITS

[75] Inventors: Masao Nakano, Kasugai; Tsuyoshi Ohira; Hirohiko Mochizuki, both of Kawasaki; Yukinori Kodama; Hidenori Nomura, both of Yokohama, all of Japan

[73] Assignees: Fujitsu Limited, Kawasaki; Fujitsu Vlsi Limited, Kasugai, both of Japan

[21] Appl. No.: 97,558

[22] Filed: Sep. 16, 1987

[30] Foreign Application Priority Data

Sep. 19, 1986 [JP] Japan ................................ 61-221020

[51] Int. Cl.$^4$ ........................ G11C 11/40; G11C 13/00
[52] U.S. Cl. ................................ 365/190; 365/189.01; 365/230.06
[58] Field of Search ............... 365/189, 190, 191, 193, 365/202, 154, 205

[56] References Cited

U.S. PATENT DOCUMENTS

| 4,578,776 | 3/1986 | Takemae et al. | 365/149 |
|---|---|---|---|
| 4,584,670 | 4/1986 | Michael | 365/149 |
| 4,589,096 | 5/1986 | Kaneko et al. | 365/154 |
| 4,601,017 | 7/1986 | Mochizuki et al. | 365/189 |

Primary Examiner—Terrell W. Fears
Attorney, Agent, or Firm—Armstrong, Nikaido Marmelstein Kubovcik & Murray

[57] ABSTRACT

A semiconductor memory device comprises a plurality of reset circuits connected to a data bus pair at different locations. Before each read operation, the reset circuits reset the data bus pair to a predetermined reset voltage. The resetting of the data bus pair is virtually unaffected by the distributed resistances and parasitic capacitances of the data bus pair, since the resetting is carried out at a plurality of locations on the data bus pair.

6 Claims, 7 Drawing Sheets

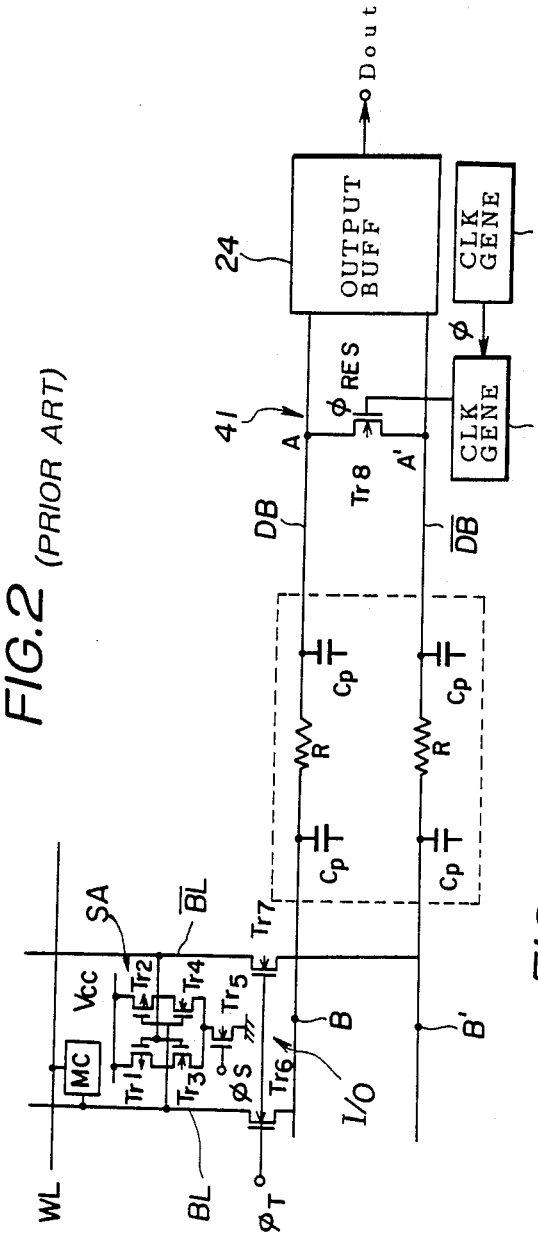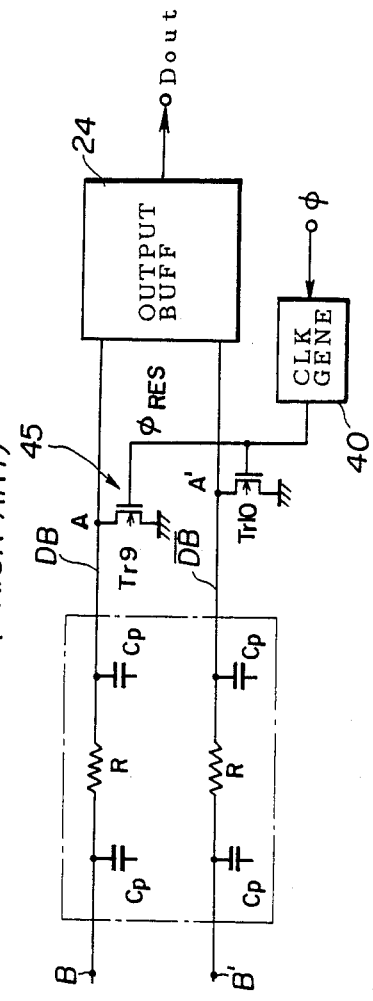

SEMICONDUCTOR MEMORY DEVICE HAVING DATA BUS RESET CIRCUITS

BACKGROUND OF THE INVENTION

The present invention generally relates to semiconductor memory devices, and more particularly to a semiconductor memory device having a plurality of reset circuits connected to a data bus pair.

As is well known, a semiconductor memory device generally comprises a memory cell array, a row decoder coupled to the memory cell array through word lines, an address buffer coupled to the row decoder, a sense amplifier and input/output gate coupled to the memory cell array through bit line pairs, a column decoder coupled to the sense amplifier and input/output gate, an address buffer coupled to the column decoder, input and output buffers coupled to the sense amplifier and input/output gate through a data bus pair, and the like. The data bus pair is reset to a reset voltage before each read operation. For example, the reset voltage is selected to a power source voltage, a ground voltage or an intermediate voltage between the power source and ground voltages.

Conventionally, a reset circuit resets the data bus pair to the reset voltage at one end of the data bus pair in a vicinity of the output buffer. However, the data bus pair can be described by an equivalent circuit which is essentially an RC circuit comprising distributed resistances and parasitic capacitances. For this reason, although the data bus pair is reset to the reset voltage relatively quickly at the one end in the vicinity of the output buffer, the other end of the data bus pair is only reset to the reset voltage after a time delay caused by the distributed resistances and the parasitic capacitances of the data bus pair.

The connection of the next selected bit line pair to the data bus pair can only be carried out after the resetting of the data bus pair is completed. Hence, the conventional memory device suffers a problem in that the access time to the memory device is long because the resetting of the data bus pair is slowed down by the distributed resistances and the parasitic capacitances of the data bus pair.

On the other hand, a noise which enters the data bus pair in the vicinity of the output buffer can be eliminated by the reset circuit when the data bus pair is reset to the reset voltage. However, when the noise enters the data bus pair on the other end from the output buffer, the elimination of the noise is also delayed because of the distributed resistances and the parasitic capacitances of the data bus pair. Thus, there is a problem in that the connection of the next selected bit line pair to the data bus pair can only be carried out after the resetting of the data bus pair is completed and after the noise is completely eliminated.

SUMMARY OF THE INVENTION

Accordingly, it is a general object of the present invention to provide a novel and useful semiconductor memory device having data bus reset circuits, in which the problems described heretofore are eliminated.

Another and more specific object of the present invention is to provide a semiconductor memory device which comprises a plurality of data bus reset circuits connected to a data bus pair at different locations. According to the semiconductor memory device of the present invention, it is possible to reset the data bus pair at a high speed, thereby enabling a high-speed operation of the memory device.

Still another object of the present invention is to provide a semiconductor memory device comprising a memory cell array comprising a plurality of memory cells arranged in a matrix arrangement, a sense amplifier, operatively connected to the memory cell array, amplifying a signal read out from one of the memory cells and having a pair of output terminals for outputting a complementary signal, a pair of data buses for transferring the complementary signal, a transfer gate for connecting the pair of output terminals to the pair of data buses responsive to a read operation, a data output buffer connected to the pair of data buses for outputting an output signal, and a plurality of reset circuits for resetting the pair of data buses to a predetermined reset voltage before each read operation responsive to a reset clock signal, respectively. The plurality of reset circuits are connected to the pair of data buses at different locations.

Other objects and further features of the present invention will be apparent from the following detailed description when read in conjunction with the accompanying drawings.

BRIEF DESCRIPTION OF THE DRAWINGS

FIGS. 2 and 3 are system circuit diagrams respectively showing examples of the conventional reset circuit together with a data bus part;

DETAILED DESCRIPTION

First, a description will be given on the general operation of the conventional memory device, so as to facilitate the understanding of the present invention.

Figure 1:
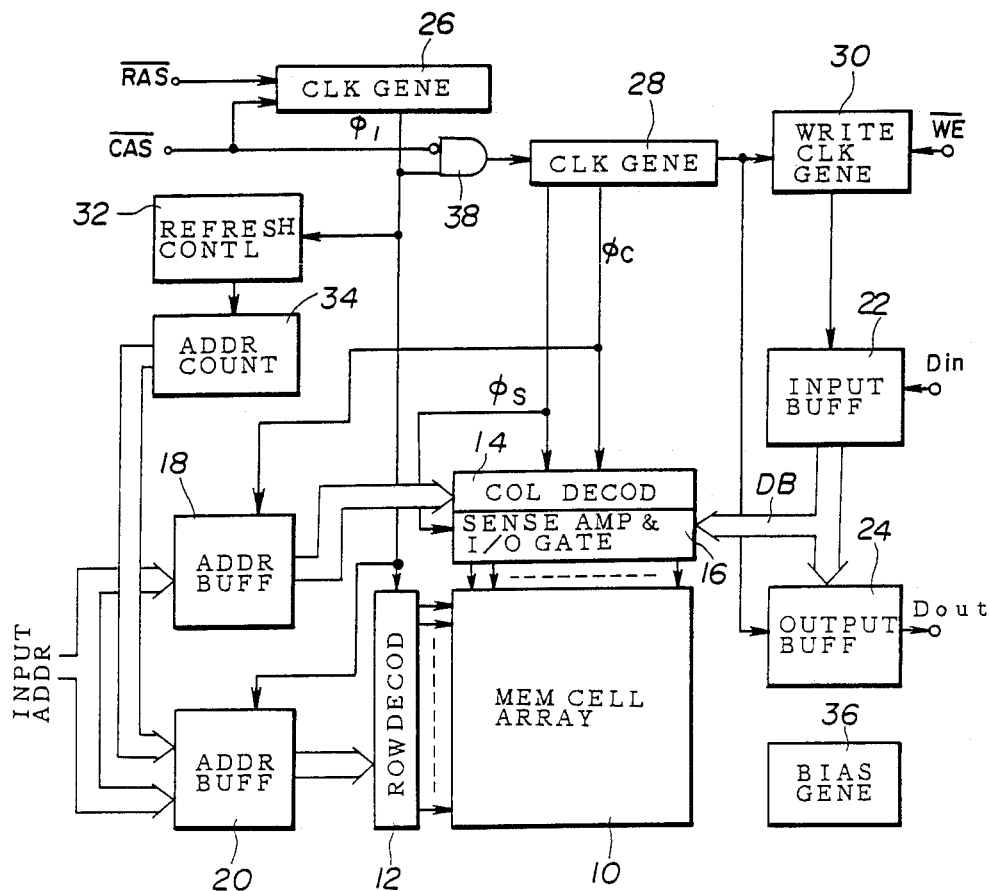
FIG. 1 is a system block diagram showing an example of the conventional memory device.

FIG. 1 shows an example of the conventional dynamic random access memory (DRAM). The DRAM generally comprises a memory cell array 10, a row decoder 12, a column decoder 14, a sense amplifier and input/output gate 16, address buffers 18 and 20, a data input buffer 22, a data output buffer 24, clock generators 26 and 28, a write clock generator 30, a refresh controller 32, an address counter 34 and an AND circuit 38 which are connected as shown, and a substrate bias generator 36 which supplies a bias voltage to a substrate (not shown) of the DRAM. In FIG. 1, $\overline{WE}$ denotes an inverted write enable signal, and $D_{in}$ denotes an input data (or write-in data).

The memory cell array 10 comprises an array of memory cells (not shown) each connected to a word line and a bit line. Generally, each memory cell of the DRAM is made up of one transistor and one capacitor, and a drain of the transistor is connected to the bit line and a gate of the transistor is connected to the word line. When a word line is selected by the row decoder 12, the transistors of all of the memory cells connected to the selected word line are turned ON and the capacitors of these memory cells are coupled to the bit lines. As a result, the potential at each bit line is changed according to the charge in the corresponding capacitor (stored information) of the memory cell.

FIG. 2 shows an example of the reset circuit together with a data bus part of the conventional memory device for one bit line pair. A memory cell MC is connected to a word line WL and a bit line BL. Before each read operation, the bit lines BL and $\overline{BL}$ are precharged to Vcc/2, for example, where Vcc denotes the power source voltage. A sense amplifier SA senses and amplifies a potential difference between the bit line BL to which the stored information is read out from the memory cell MC and the bit line $\overline{BL}$ responsive to a clock signal $\phi_S$. The sense amplifier SA comprises two P-channel transistors Tr1 and Tr2 and three N-channel transistors Tr3, Tr4 and Tr5 which are connected as shown to constitute a flip-flop, and the sense amplifier SA becomes active when the transistor Tr5 is turned ON responsive to the clock signal $\phi_S$. As a result, one of the bit lines BL and $\overline{BL}$ having a higher level is pulled up to a power source voltage Vcc while the other of the bit lines BL and $\overline{BL}$ is pulled down to a ground voltage Vss. An input/output gate I/O selected by the column decoder 14 is turned ON responsive to a clock signal $\phi_T$, and the output of the sense amplifier SA obtained through a bit line pair constituted by the bit lines BL and $\overline{BL}$ is supplied to a data bus pair constituted by data buses DB and $\overline{DB}$. In other words, the input/ottput gate I/O connects the bit line pair to the data bus pair when turned ON and disconnects the bit line pair from the data bus pair when turned OFF. The data on the data bus pair is read out as read-out data $D_{out}$ through the data output buffer 24. The input/output gate I/O comprises a pair of N-channel transistors Tr6 and Tr7 (transfer gates) which are respectively connected to the bit lines BL and $\overline{BL}$. The sense amplifier A and the input/output gate I/O constitute the sense amplifier and input/output gate 16 for one bit line pair.

The data bus pair extends for a length amounting to approximately one-half of or the full width of a longer side of the semiconductor chip of the DRA. Hence, the data bus pair can be described by the equivalent circuit indicated by a phantom line in FIG. 2 which is essentially an RC circuit comprising distributed resistances R and parasitic capacitances Cp. When the data is read out from the memory cell MC, the potential at one of the data bus pair becomes high while the potential at the other of the data bus pair becomes low. Before the next data is read out, the data bus pair is reset to an intermediate voltage Vcc/2 between the power source voltage Vcc and the ground voltage Vss by a reset circuit 41 which operates responsive to a reset clock signal $\phi_{RES}$, and the reset data bus pair is coupled to the bit line pair so that the data buses DB and $\overline{DB}$ respectively take the high and low levels (or low and high levels) depending on the potentials at the corresponding bit lines BL and $\overline{BL}$. The reset circuit 41 comprises an N-channel transistor Tr8, and a clock generator 40 generates the reset clock signal $\phi_{RES}$ from a clock signal $\phi$ which is generated from the clock generator 28.

FIG. 3 shows another example of the reset circuit together with the data bus part. In FIG. 3, those parts which are the same as those corresponding parts in FIG. 2 are designated by the same reference numerals, and a description thereof will be omitted. Further, the illustration of the bit line part and the clock generator 28 will be omitted. In FIG. 3, the data bus pair is reset to the ground voltage Vss by a reset circuit 45 which operates responsive to the reset clock signal $\phi_{RES}$. The reset circuit 45 comprises an N-channel transistor Tr9 connected to the data bus DB and an N-channel transistor Tr10 connected to the data bus $\overline{DB}$.

However, the reset circuits 41 and 45 shown in FIGS. 2 and 3 are respectively connected to the data bus pair at points A and A' in a vicinity of the data output buffer 24. For this reason, although the data bus pair is reset to the reset voltage relatively quickly at the points A and A' in the vicinity of the data output buffer 24, the data bus pair at points B and B' on the opposite end from the points A and A' is only reset to the reset voltage after a time delay caused by the distributed resistances R and the parasitic capacitances Cp of the data bus pair.

Figure 5:
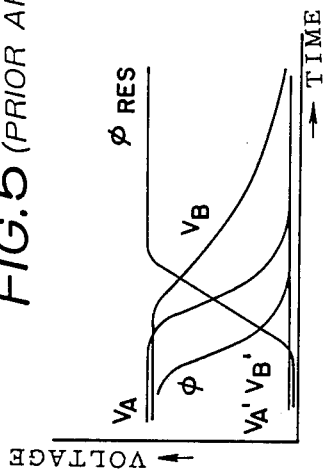
FIGS. 4 and 5 are time charts for explaining the reset operation of the reset circuits respectively shown in FIGS.2 and 3.
Figure 4:
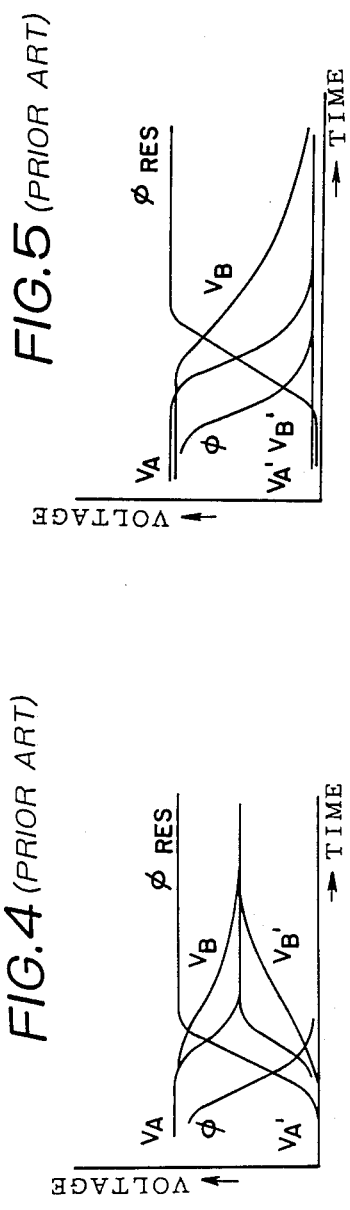

FIG. 4 shows the voltage change on the data bus pair with respect to the reset clock signal $\phi_{RES}$ for the circuit shown in FIG. 2 wherein the reset voltage of the data bus pair is set to Vcc/2. Similarly, FIG. 5 shows the voltage change on the data bus pair with respect to the reset clock signal $\phi_{RES}$ for the circuit shown in FIG. 3 wherein the reset voltage of the data bus pair is set to Vss. In FIGS.4 and 5, $V_A$ and $V_{A'}$ respectively denote the voltages on the data buses DB and $\overline{DB}$ at the points A and A', and $V_B$ and $V_{B'}$ respectively denote the voltages on the data buses DB and $\overline{DB}$ at the points B and B'.

The connection of the next selected bit line pair to the data bus pair can only be carried out after the resetting of the data bus pair is completed. Hence, the conventional memory device suffers a problem in that the access time to the memory device is long because the resetting of the data bus pair is slowed down by the distributed resistances R and the parasitic capacitances Cp of the data bus pair.

On the other hand, a noise which enters the data bus pair in the vicinity of the points A and A' can be eliminated by the reset circuit 41 or 45 when the data bus pair is reset to the reset voltage. However, when the noise enters the data bus pair in the vicinity of the points B and B', the elimination of the noise is also delayed because of the distributed resistances R and the parasitic capacitances Cp of the data bus pair. Thus, there is a problem in that the connection of the next selected bit line pair to the data bus pair can only be carried out after the resetting of the data bus pair is completed and after the noise is completely eliminated. In other words, the input/output gate I/O can only be opened after the noise is completely eliminated because the operation of the memory device would otherwise be affected by the noise.

The present invention eliminates the problems of the conventional memory device by providing a plurality of reset circuits which are connected to the data bus pair at different locations.

Figure 6:
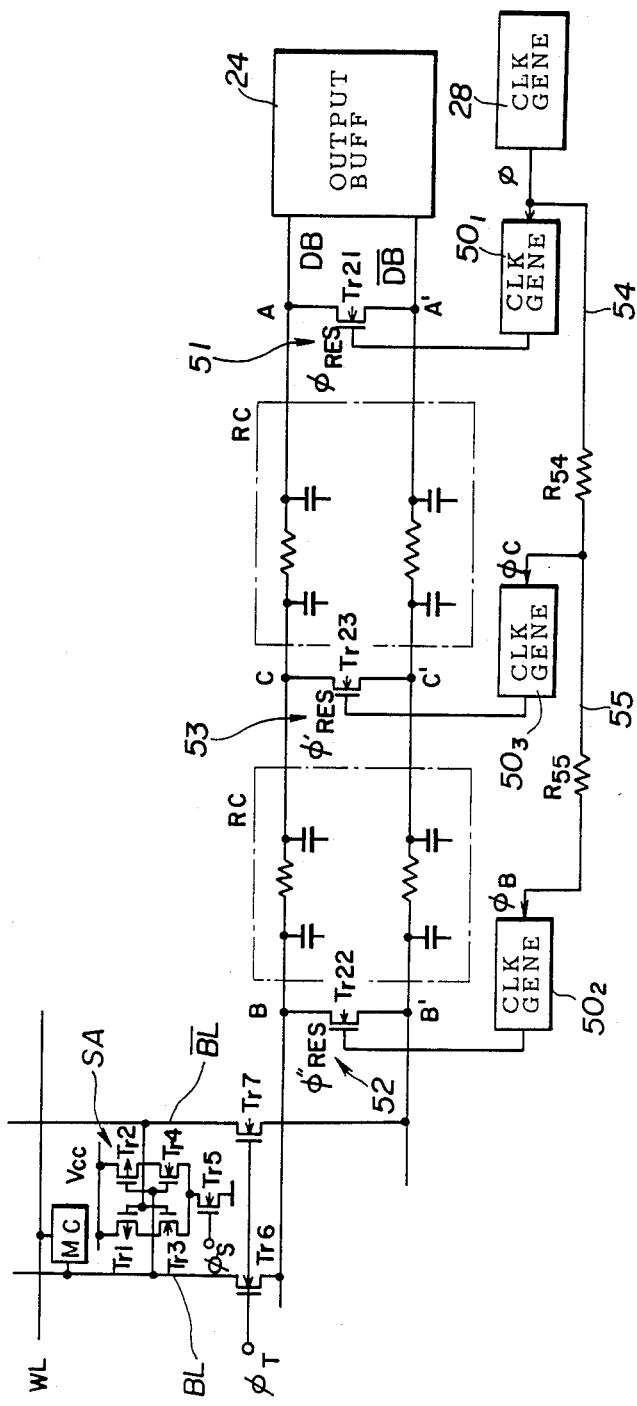
FIG.6 is a system circuit diagram showing an essential part of a first embodiment of the memory device according to the present invention.

FIG. 6 shows an essential part of a first embodiment of the memory device according to the present invention. It will be assumed in the present embodiment and in the embodiments which will be described later that the memory device has the basic construction shown in FIG. 1. In FIG. 6, those parts which are the same as those corresponding parts in FIG. 2 are designated by the same reference numerals, and a description thereof will be omitted. In FIG. 6, RC indicated by a phantom line denotes RC circuit constituted by the distributed resistances and the parasitic capacitances of the data bus pair.

When an inverted row address strobe $\overline{RAS}$ is applied to the clock generator 26 shown in FIG. 1, the clock generator 26 generates an internal clock signal $\phi_1$. The address buffer 20 and the row decoder 12 are operated responsive to the internal clock signal $\phi_1$, and the word line WL shown in FIG. 6 is selected. In FIG. 6, the precharge level of th bit line pair is set to Vcc/2. The capacitor of the memory cell MC charges or discharges the bit line BL depending on the stored information, and the potential difference occurs between the bit lines BL and $\overline{BL}$. The internal clock signal $\phi_1$ passes through the AND circuit 38 which is open due to a low-level inverted column address strobe $\overline{CAS}$, and is supplied to the clock generator 28. The clock generator 28 generates the clock signal $\phi_S$, and the sense amplifier SA of the sense amplifier and input/output gate 16 is made active responsive to the clock signal $\phi_S$. Hence, the sense amplifier SA pulls up the potential at the bit line BL to the power source voltage Vcc and pulls down the potential at the bit line $\overline{BL}$ to the ground voltage Vss, for example.

The clock signal $\phi_S$ from the clock generator 28 is also supplied to the column decoder 14, and the column decoder 14 generates the clock signal $\phi_T$ according to the address from the address buffer 18. As described before, this clock signal $\phi_T$ is used to turn ON the selected input/output gate I/O (that is, the transistors Tr6 and Tr7).

In the first embodiment shown in FIG. 6, three reset circuits 51, 52 and 53 reset the data bus pair before each read operation. The reset circuit 51 comprises an N-channel transistor Tr21 connected to the data buses DB and $\overline{DB}$ at the points A and A' in the vicinity of the output buffer 24. The reset circuit 52 comprises an N-channel transistor Tr22 connected to the data buses DB and $\overline{DB}$ at the points B and B' on the other end from the points A and A'. In addition, the reset circuit 53 comprises an N-channel transistor Tr23 connected to the data buses DB and $\overline{DB}$ at intermediate points C and C'.

The reset circuits 51, 53 and 52 are respectively turned ON responsive to reset clock signals $\phi_{RES}$, $\phi'_{RES}$ and $\phi''_{RES}$. These reset clock signals $\phi_{RES}$, $\phi'_{RES}$ and $\phi''_{RES}$ are respectively generated by clock generators $50_1$, $50_2$ and $50_3$ which are triggered by the clock signal $\phi$ from the clock generator 28. The clock signal $\phi$ is supplied to the clock generator $50_2$ through wires 54 and 55 as a clock signal $\phi_B$, and the clock signal $\phi$ is supplied to the clock generator $50_3$ through the wire 54 as a clock signal $\phi_C$. In FIG. 6, $R_{54}$ and $R_{55}$ respectively denote the wire resistances of the wires 54 and 55.

Figure 7:
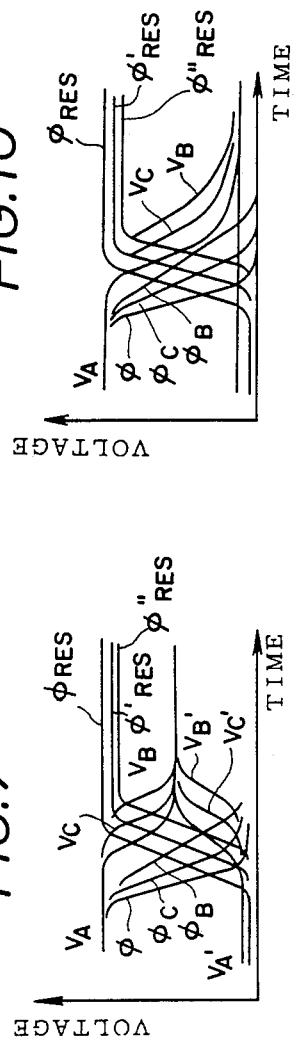
FIG. 7 is a time chart for explaining the reset operation in the first embodiment shown in FIG. 6.

FIG. 7 is a time chart showing the voltage changes in the circuit shown in FIG. 6. In FIG. 7 and FIGS. 10, 11 and 13 which will be described later $V_A$ through $V_C$ denote the voltages at the respective points A through C, and $V_{A'}$ through $V_{C'}$ denote the voltages at the respective points A' through C'. As may be seen from FIG. 7, the data bus pair is reset to Vcc/2 in the present embodiment. The clock signal $\phi$ is supplied directly to the clock generator $50_1$, but the clock signal $\phi$ is supplied to the clock generator $50_2$ through the wires 54 and 55 and the clock generator $50_3$ through the wire 54. For this reason, the clock signals $\phi_B$ and $\phi_C$ which actually trigger the respective clock generators $50_2$ and $50_3$ are delayed with respect to the clock signal $\phi$ as shown in FIG. 7 due to the wire resistances $R_{54}$ and $R_{55}$ and the parasitic capacitances of the wires 54 and 55. Consequently, the reset clock signal $\phi'_{RES}$ and $\phi''_{RES}$ are delayed with respect to the reset clock signal $\phi_{RES}$, and the transistors Tr21, Tr23 and Tr22 are turned ON in this sequence so as to short-circuit te data buses DB and $\overline{DB}$.

The short-circuiting of the data buses DB and $\overline{DB}$ at the points A and A', B and B' and C and C' does not occur simultaneously. However, the delay in the short-circuiting at the points C and C' and B and B' with respect to the short-circuiting at the points A and A' is extremely small compared to the time it takes for the data bus pair to be reset completely at the points B and B' in FIG. 2 from the time when the data bus pair is reset at the points A and A'. In other words, the delay in the short-circuiting caused by the wires 54 and 55 is negligible, and the time it takes to completely reset the data bus pair is extremely short compared to the circuit shown in FIG. 2. Therefore, it is possible to reset the data bus pair to the reset voltage Vss/2 at a high speed.

Figure 8:
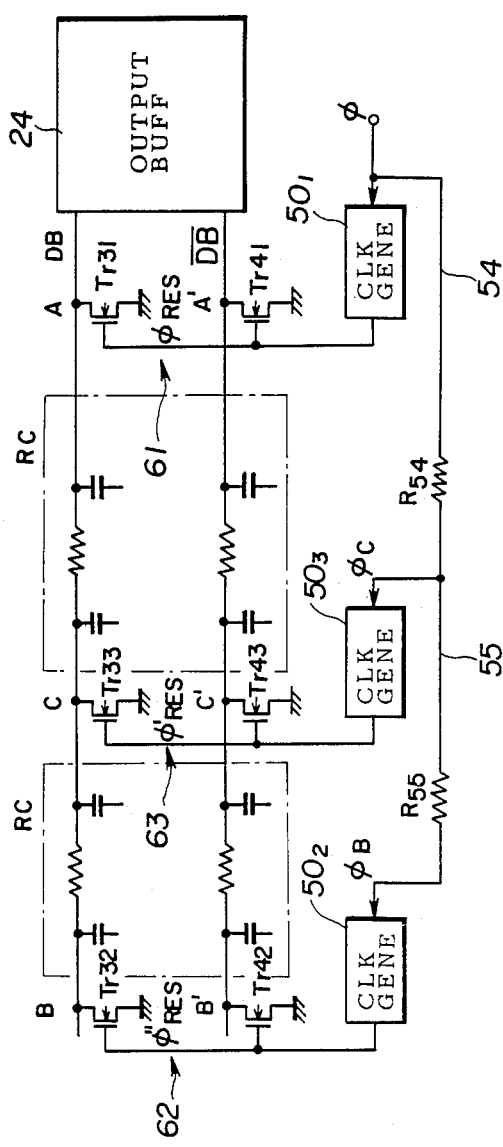

FIG. 8 shows an essential part of a second embodiment of the memory device according to the present invention. In FIG. 8, those parts which are the same as those corresponding parts in FIG. 6 are designated by the same reference numerals, and a description thereof will be omitted. In FIG. 8, the illustration of the bit line part and the clock generator 28 will be omitted. In the present embodiment, the data bus pair is reset to the ground voltage Vss.

In the second embodiment shown in FIG. 8, three reset circuits 61, 62 and 63 reset the data bus pair before each read operation. The reset circuit 61 comprises N-channel transistors Tr31 and Tr41 connected to the data buses DB and $\overline{DB}$ at the points A and A' in the vicinity of the output buffer 24. The reset circuit 62 comprises N-channel transistors Tr32 and Tr42 connected to the data buses DB and $\overline{DB}$ at the points B and B' on the other end from the points A and A'. In addition, the reset circuit 63 comprises N-channel transistors Tr33 and Tr43 connected to the data buses DB and $\overline{DB}$ at intermediate points C and C'. The reset circuits 61, 63 and 62 are respectively turned ON responsive to reset clock signals $\phi_{RES}$, $\phi'_{RES}$ and $\phi''_{RES}$.

Figure 9:
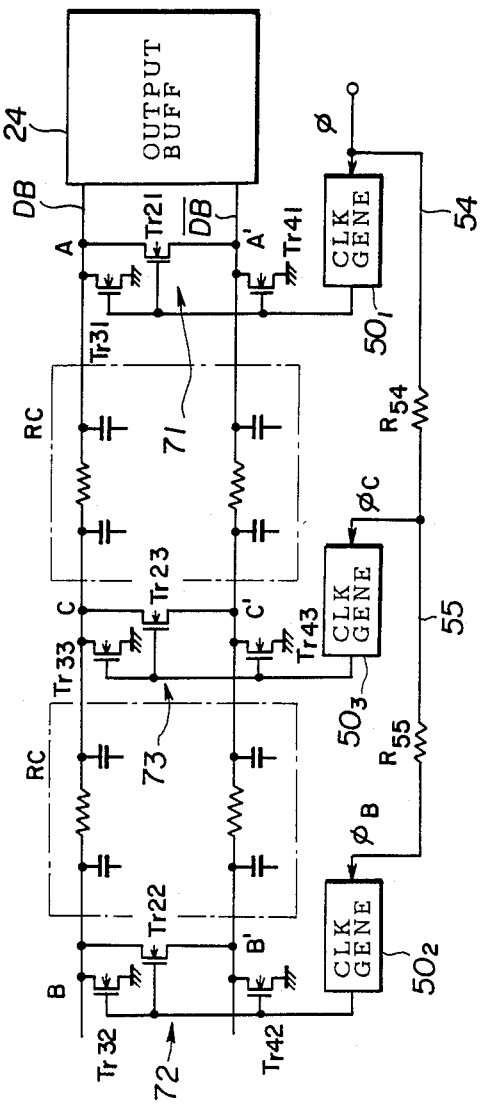
FIGS. 8 and 9 are system circuit diagrams respectively showing essential parts of second and third embodiments of the memory device according to the present invention.

FIG. 9 shows an essential part of a third embodiment of the memory device according to the present invention. In FIG. 9, those parts which are the same as those corresponding parts in FIGS. 6 and 8 are designated by the same reference numerals, and a description thereof will be omitted. In the present embodiment, the data bus pair is reset to the ground voltage Vss.

In the third embodiment shown in FIG. 9, three reset circuits 71, 72 and 73 reset the data bus pair before each read operation. The reset circuit 71 comprises N-channel transistors Tr21, Tr31 and Tr41 connected to the data buses DB and $\overline{DB}$ at the points A and A' in the vicinity of the output buffer 24. The reset circuit 72 comprises N-channel transistors Tr22, Tr32 and Tr42 connected to the data buses DB and $\overline{DB}$ at the points B and B' on the other end from the points A and A'. In addition, the reset circuit 73 comprises N-channel transistors Tr23, Tr33 and Tr43 connected to the data buses DB and $\overline{DB}$ at intermediate points C and C'. The reset circuits 71, 73 and 72 are respectively turned ON responsive to reset clock signals $\phi_{RES}$, $\phi'_{RES}$ and $\phi''_{RES}$.

Figure 10:
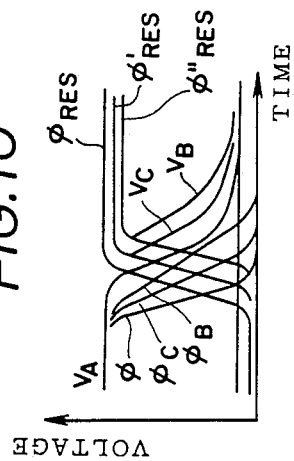
FIGS. 10 and 11 are time charts for explaining the reset operation in the second and third embodiments respectively shown in FIGS.8 and 9.

FIG. 10 is a time chart showing the voltage changes in the circuit shown in FIG. 8. As may be seen from FIG. 10, the data bus pair is reset to the ground voltage Vss. The reset clock signal $\phi'_{RES}$ and $\phi''_{RES}$ are delayed with respect to the reset clock signal $\phi_{RES}$, and the transistor pairs respectively constituted by the transistors Tr31 and Tr41, the transistors Tr33 and Tr43, and the transistors Tr32 and Tr42 are turned ON in this sequence so as to short-circuit and ground the data buses DB and $\overline{DB}$.

Figure 11:
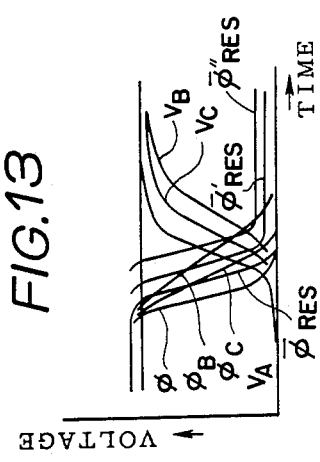

FIG. 11 is a time chart showing the voltage changes in the circuit shown in FIG. 9. As may be seen from FIG. 11 the data bus pair is reset to the ground voltage Vss. The reset clock signal $\phi'_{RES}$ and $\phi''_{RES}$ are delayed with respect to the reset clock signal $\phi_{RES}$, and the transistor groups respectively constituted by the transistors Tr21, Tr31 and Tr41, the transistors Tr23, Tr33 and Tr43, and the transistors Tr22, Tr32 and Tr42 are turned ON in this sequence so as to short-circuit and ground the data buses DB and $\overline{DB}$.

In the second and third embodiments, the short-circuiting and grounding of the data buses DB and $\overline{DB}$ at the points A and A', B and B' and C and C' does not occur simultaneously. However, the delay in the short-circuiting and grounding at the points C and C' and B and B' with respect to the short-circuiting and grounding at the points A and A' is extremely small compared to the time it takes for the data bus pair to be reset completely at the points B and B' in FIG. 3 from the time when the data bus pair is reset at the points A and A'. In other words, the delay in the short-circuiting and grounding caused by the wires 54 and 55 is negligible, and the time it takes to completely reset the data bus pair is extremely short compared to the circuit shown in FIG. 3. Therefore, it is possible to reset the data bus pair to the reset voltage Vss at a high speed.

Figure 12:
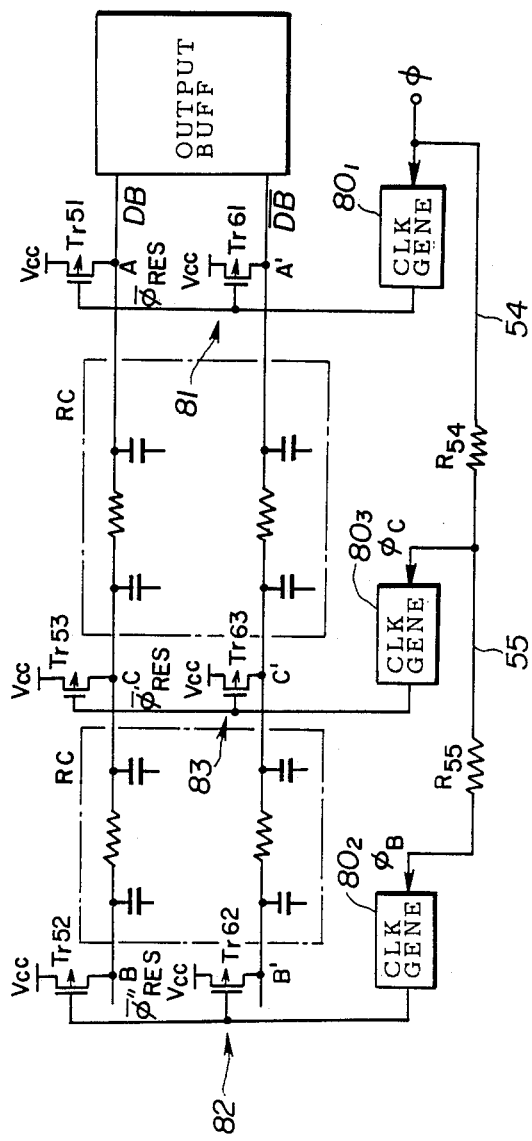
FIG. 12 is a system circuit diagram showing an essential part of a fourth embodiment of the memory device according to the present invention.

FIG. 12 shows an essential part of a fourth embodiment of the memory device according to the present invention. In FIG. 12, those parts which are the same as those corresponding parts in FIG. 6 are designated by the same reference numerals, and a description thereof will be omitted. In FIG. 12, the illustration of the bit line part and the clock generator 28 will be omitted. In the present embodiment, the data bus pair is reset to the power source voltage Vcc.

In the fourth embodiment shown in FIG. 12, three reset circuits 81, 82 and 83 reset the data bus pair before each read operation. The reset circuit 81 comprises P-channel transistors Tr51 and Tr61 connected to the data buses DB and $\overline{DB}$ at the points A and A' in the vicinity of the output buffer 24. The reset circuit 82 comprises P-channel transistors Tr52 and Tr62 connected to the data buses DB and DB at the points B and B' on the other end from the points A and A'. In addition, the reset circuit 83 comprises P-channel transistors Tr53 and Tr63 connected to the data buses DB and DB at intermediate points C and C'. The reset circuits 81, 83 and 82 are respectively turned ON responsive to reset clock signals $\phi_{RES}$, $\phi'_{RES}$ and $\phi''_{RES}$. These reset clock signals $\phi_{RES}$, $\phi'_{RES}$ and $\phi''_{RES}$ are respectively generated by clock generators $80_1$, $80_2$ and $80_3$ which are triggered by the clock signal $\phi$ from the clock generator 28. The clock signal $\phi$ is sppplied to the clock generator $80_2$ through the wires 54 and 55 as the clock signal $\phi_B$, and the clock signal $\phi$ is supplied to the clock generator $80_3$ through the wire 54 as the clock signal $\phi_C$.

Figure 13:
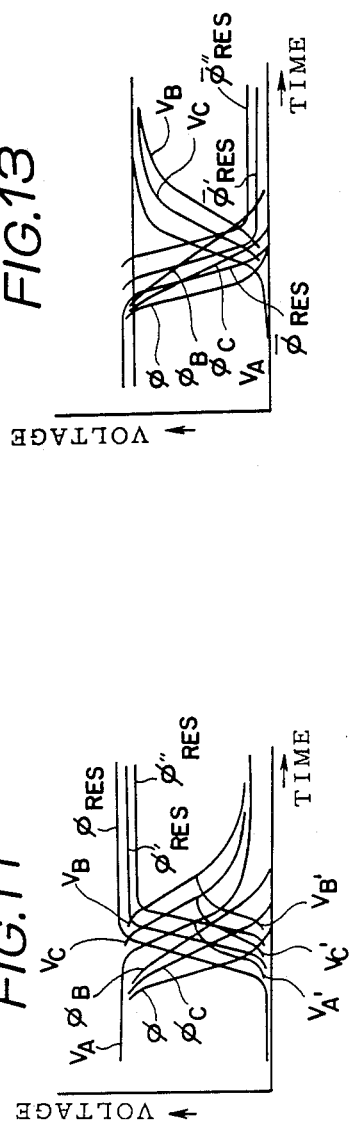
FIG. 13 is a time chart for explaining the reset operation in the fourth embodiment shown in FIG. 12.

FIG. 13 is a time chart showing the voltage changes in the circuit shown in FIG. 12. As may be seen from FIG. 13, the data bus pair is reset to the power source voltage Vcc. The reset clock signal $\phi'_{RES}$ and $\phi''_{RES}$ are delayed with respect to the reset clock signal $\phi_{RES}$, and the transistor pairs respectively constituted by the transistors Tr51 and Tr61, the transistors Tr53 and Tr63, and the transistors Tr52 and Tr62 are turned ON in this sequence so as to short-circuit and ground the data buses DB and $\overline{DB}$.

In the fourth embodiment, the connection of the data buses DB and $\overline{DB}$ to the power source voltage Vcc at the points A and A', B and B' and C and C' does not occur simultaneously. However, the delay in the connection to the power source voltage Vcc at the points C and C' and B and B' with respect to the connection to the power source voltage Vcc at the points A and A' is extremely small compared to the time it takes for the data bus pair to be reset completely at the points B and B' from the time when the data bus pair is reset at the points A and A' in the conventional memory device having only one reset circuit for resetting the the data bus pair to the reset voltage Vcc. In other words, the delay in the connection to the power source voltage Vcc caused by the wires 54 and 55 is negligible, and the time it takes to completely reset the data bus pair is extremely short compared to that of the conventional memory device. Therefore, it is possible to reset the data bus pair to the reset voltage Vcc at a high speed.

In the example shown in FIG. 2, for example, the transistor Tr8 resets the data bus pair to Vcc/2 and the entire charge on the data bus pair is applied on the transistor Tr8. For this reason, a relatively bulky transistor having a large capacity must be used for the transistor Tr8, and a relatively bulky clock generator must be used for the clock generator 40 to drive the transistor Tr8. On the other hand, in the first embodiment shown in FIG. 6, the three transistors Tr21, Tr22 and Tr23 reset the data bus pair to Vcc/2, and the entire charge on the data bus pair is applied distributively on the transistors Tr21, Tr22 and Tr23. Therefore, transistors having small capacities may be used for the transistors Tr21, Tr22 and Tr23, and small clock generators may be used for the clock generators $50_1$, $50_2$ and $50_3$. For this reason, although the number of transistors and clock generators used in the first embodiment is large compared to that of the example shown in FIG. 2, the total area occupied by the transistors and the clock generators will not exceed the total area occupied by the relatively bulky transistor and the relatively bulky clock generator of the example shown in FIG. 2. The same applies to the second through fourth embodiments.

Figure 14A:
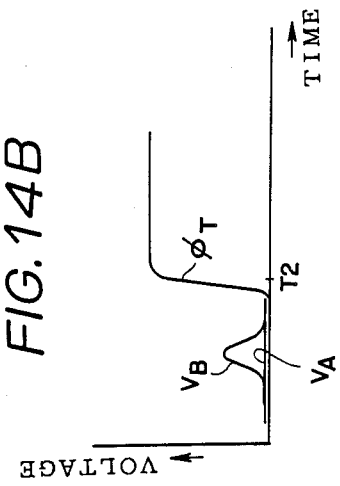
FIGS. 14A and 14B are time charts for explaining the elimination of noise on a data bus pair in the conventional memory device and the memory device according to the present invention.
Figure 14B:
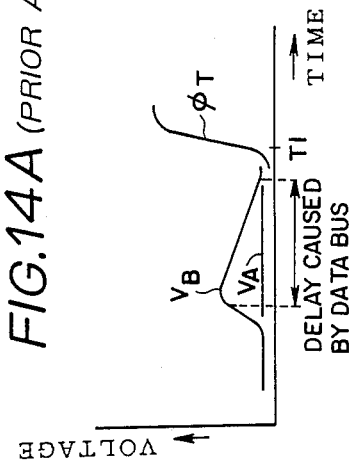

FIG. 14A is a time chart for explaining the elimination of noise on the data bus pair in the conventional memory device. When a noise enters the data bus pair at the points B and B', for example, the elimination of the noise by the reset circuit (transistor Tr8 in the case of the example shown in FIG. 2) is delayed by the time constant determined by the distributed resistances R and the parasitic capacitances Cp of the data bus pair. This time constant is in the order of a few nsec, for example, as shown in FIG. 14A. Therefore, it is only possible to open the input/output gate I/O at a time T1 when the noise is completely eliminated, because the operation of the memory device would otherwise by affected by the noise. In FIG. 14A and FIG. 14B which will be described hereunder, $\phi_T$ denotes the clock signal which controls the input/output gate I/O.

On the other hand, FIG. 14B is a time chart for explaining the elimination of noise on the data bus pair in the embodiments. When a noise enters the data bus pair at the points B and B' in the embodiments described heretofore, the noise is eliminated almost immediately by the reset circuit (52, 62, 72 or 82) which is connected closest to the points B and B'. Hence, the noise is not transferred to the points A and A'. Hence, it is possible to open the input/output gate I/O at a time T2 when the noise is completely eliminated, and the timing with which the input/output gate I/O can be opened is quickened by an amount corresponding to the time constant determined by the distributed resistances R and the parasitic capacitances Cp of the data bus pair. Accordingly, the high-speed operation of the memory device can be realized also from this point of view.

In the embodiments described heretofore, three reset circuits are connected to the data bus pair at three different locations. However, it is possible to provide only two reset circuits and connect the two reset circuits at opposite ends of the data bus pair, for example. It is also possible to provide more than three reset circuits and connect these reset circuits at different locations.

Further, the present invention is not limited to these embodiments, but various variations and modifications may be made without departing from the scope of the present invention.

What is claimed is:

1. A semiconductor memory device comprising:
   a memory cell array includes a plurality of memory cells arranged in a matrix arrangement;
   a sense amplifier, connected to said memory cell array, amplifying a signal read out from one of said memory cells and having a pair of output terminals for outputting a complementary signal;
   a pair of data buses for transferring the complementary signal;
   a transfer gate for connecting said pair of output terminals to said pair of data buses responsive to a read operation;
   a data output buffer connected to said pair of data buses for outputting an output signal; and
   a plurality of reset circuits for resetting said pair of data buses to a predetermined reset voltage before each read operation responsive to a reset clock signal, respectively,
   said plurality of reset circuits being connected to said pair of data buses at different locations.

2. A semiconductor memory device as claimed in claim 1 in which one of said plurality of reset circuits is connected to said pair of data buses at a first end in a vicinity of said data output buffer, and another of said plurality of reset circuits is connected to said pair of data buses in a vicinity of a second end opposite to said first end.

3. A semiconductor memory device as claimed in claim 1 in which a first reset circuit out of said plurality of reset circuits is connected to said pair of data buses at a first end in a vicinity of said data output buffer, a second reset circuit out of said plurality of reset circuits is connected to said pair of data buses in a vicinity of a second end opposite to said first end, and a third reset circuit out of said plurality of reset circuits is connected to said pair of data buses at an intermediate part between said first and second ends.

4. A semiconductor memory device as claimed in claim 1 in which said plurality of reset circuits resets said pair of data buses to a ground voltage.

5. A semiconductor memory device as claimed in claim 1 in which said plurality of reset circuits resets said pair of data buses to a power source voltage.

6. A semiconductor memory device as claimed in claim 1 in which said plurality of reset circuits resets said pair of data buses to an intermediate voltage between a power source voltage and a ground voltage.

* * * * *